(12) United States Patent
Sato

(10) Patent No.: US 8,613,623 B2
(45) Date of Patent: Dec. 24, 2013

(54) ACRYLIC INSULATING ADHESIVE

(75) Inventor: Daisuke Sato, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 285 days.

(21) Appl. No.: 13/060,915

(22) PCT Filed: Sep. 2, 2009

(86) PCT No.: PCT/JP2009/065289

§ 371 (c)(1),
(2), (4) Date: Feb. 25, 2011

(87) PCT Pub. No.: WO2010/038574

PCT Pub. Date: Apr. 8, 2010

(65) Prior Publication Data

US 2011/0159713 A1    Jun. 30, 2011

(30) Foreign Application Priority Data

Sep. 30, 2008    (JP) ................................. 2008-252745

(51) Int. Cl.
*C08L 33/10* (2006.01)
*C08L 9/00* (2006.01)
*C08L 13/00* (2006.01)

(52) U.S. Cl.
USPC ............... 439/78; 29/831; 524/500; 524/533; 524/540

(58) Field of Classification Search
USPC ............... 29/831; 524/500, 533, 540; 439/78
See application file for complete search history.

(56) References Cited

U.S. PATENT DOCUMENTS

| 7,258,918 | B2 * | 8/2007 | Tsukagoshi et al. .... | 428/355 EP |
| 7,578,891 | B2 * | 8/2009 | Ookubo et al. ............. | 148/33.3 |
| 2005/0178502 | A1 | 8/2005 | Arifuku et al. | |

FOREIGN PATENT DOCUMENTS

| JP | A-60-262430 | 12/1985 |
| JP | A-63-86539 | 4/1988 |
| JP | A-2001-19821 | 1/2001 |
| JP | A-2001-189346 | 7/2001 |
| JP | A-2002-76589 | 3/2002 |
| JP | A-2002-167556 | 6/2002 |
| JP | A-2002-363218 | 12/2002 |
| JP | A-2003-82034 | 3/2003 |
| JP | A-2003-253238 | 9/2003 |
| JP | A-2003-282637 | 10/2003 |
| JP | A-2005-206717 | 8/2005 |
| JP | A-2006-127776 | 5/2006 |
| JP | A-2006-274120 | 10/2006 |
| JP | A-2007-302881 | 11/2007 |
| JP | A-2008-45139 | 2/2008 |
| JP | A-2008-150550 | 7/2008 |
| JP | A-2008-231366 | 10/2008 |
| WO | WO 01/14484 A1 | 3/2001 |
| WO | WO 2006/098352 A1 | 9/2006 |

OTHER PUBLICATIONS

International Search Report dated Nov. 2, 2009 in International Patent Application No. PCT/JP2009/065289 (with translation).
International Preliminary Report on Patentability issued in International Patent Application No. PCT/JP2009/065289 dated May 19, 2011.

* cited by examiner

*Primary Examiner* — Thao T. Tran
(74) *Attorney, Agent, or Firm* — Oliff & Berridge, PLC

(57) ABSTRACT

A radical-polymerizable acrylic insulating adhesive for NCF-bonding an electronic part to a circuit board includes a (meth)acrylate monomer, a film-forming resin, an inorganic filler, a silane coupling agent, and a radical polymerization initiator. The amount of the inorganic filler is 70 to 160 parts by mass with respect to a total of 100 parts by mass of the (meth)acrylate monomer and the film-forming resin. A radical polymerization cured product of the acrylic insulating adhesive exhibits a glass transition temperature of 150 to 185° C., a linear expansion coefficient ($\alpha 1$) of 30 to 35 ppm in a temperature range that is lower than the glass transition temperature, and a linear expansion coefficient ($\alpha 2$) of 105 to 125 ppm in a temperature range that is equal to or higher than the glass transition temperature. Further, $\alpha 2/\alpha 1$ is greater than or equal to 3.4.

7 Claims, No Drawings

ACRYLIC INSULATING ADHESIVE

TECHNICAL FIELD

The present invention relates to a radical-polymerizable acrylic insulating adhesive for bonding an electronic part, such as an IC chip, to a circuit board, a connection structure in which an electronic part is fixed to a circuit board by a radical polymerization cured product of this adhesive, and a production method thereof.

BACKGROUND ART

Recently, with the increasing integration of IC chips, the space between the bumps of an IC chip is being narrowed to a finer pitch. Furthermore, the bump surface area is also being reduced. When bonding an IC chip to a circuit board, an anisotropic conductive film has widely used. However, since the lower limit of the particle size of the conductive particles is about 2 μm, it was difficult to use such an anisotropic conductive film for the bonding of a highly integrated IC chip and a circuit board. Furthermore, when a stud bump produced utilizing a bonding machine is used as a bump designed to handle a fine pitch and a smaller surface area, there is the drawback that the trapping of the conductive particles is low due to the bumps being formed into a roughly conical shape with the collapsing tips. Consequently, a technique is now used in which the bumps of the IC chip and the connection pads of the circuit board are directly bonded (NCF bonded) using an insulating adhesive, without the use of an anisotropic conductive film.

As an insulating adhesive used in such NCF bonding, conventionally, a thermosetting epoxy resin adhesive (Patent Document 1) has been used which exhibits a high cohesive force and which can ensure a high adhesion strength with respect to the adherend due to hydroxyl groups produced from a thermosetting reaction. However, although thermosetting epoxy resin adhesives have a good cohesive force and can ensure a good adhesion strength with respect to the adherend, their polymerization reaction temperature is a comparatively high 180 to 250° C. Moreover, since a thermosetting time of several hours is required, the IC chip can suffer damage during the thermosetting, and the bonding productivity is also low.

Accordingly, an attempt has been made to utilize an acrylic insulating adhesive that can undergo radical polymerization at a comparatively low temperature and in a short time in NCF bonding (Patent Document 2).

PRIOR ART DOCUMENTS

Patent Documents

[Patent Document 1] Japanese Patent Application Laid-Open No. 2001-189346
[Patent Document 2] Japanese Patent Application Laid-Open No. 2003-82034

SUMMARY OF THE INVENTION

Problems to be Solved by the Invention

However, a radical polymerization cured product of the acrylic insulating adhesive according to Patent Document 2 has a comparatively low glass transition temperature of −30 to 10° C. Furthermore, the content of the inorganic filler used for improving the physical properties is 5 to 40 parts by weight with respect to 100 parts by weight of the cured resin, which is comparatively low. Therefore, although this acrylic insulating adhesive has advantages in terms of stress relaxation of the bonding portion, cohesive force and heat resistance are insufficient, and there is also a problem with the dimensional stability. Consequently, the acrylic insulating adhesive according to Patent Document 2 cannot be expected to have good connection reliability. Therefore, in Patent Document 2, as illustrated in the embodiments, when bonding an IC chip to a circuit board, an epoxy resin and an epoxy resin curing agent are added to the adhesive. During the bonding, the adhesive has to be cured by an anionic ring-opening polymerization reaction, not a radical reaction. Consequently, polymerization curing conditions of 140° C. for 5 hours are still required. Thus, fixing of an electronic part, such as an IC chip, to a circuit board by rapid radical polymerization curing of an acrylic insulating adhesive at a low temperature and direct bonding with high connection reliability of the bumps of an IC chip and the connection pads of a circuit board are yet to be realized.

It is an object of the present invention to provide, as an insulating adhesive for NCF bonding an electronic part to a circuit board, a radical-polymerizable acrylic insulating adhesive which has excellent low-temperature, rapid-polymerization curing properties, and which can realize good connection reliability.

Means for Solving the Problems

The present inventor discovered that the object of the present invention could be achieved by incorporating an inorganic filler, in an amount larger than before, into an acrylic insulating adhesive formed from a (meth)acrylate monomer, a film-forming resin, an inorganic filler, a silane coupling agent, and a radical polymerization initiator, setting the glass transition temperature to be much higher than conventionally, and setting the linear expansion coefficients either side of that glass transition temperature to be in specific ranges, respectively, thereby completing the present invention.

More specifically, the present invention provides an acrylic insulating adhesive for fixing an electronic part to a circuit board, comprising a (meth)acrylate monomer, a film-forming resin, an inorganic filler, a silane coupling agent, and a radical polymerization initiator, wherein an amount of the inorganic filler is 70 to 160 parts by mass with respect to a total of 100 parts by mass of the (meth)acrylate monomer and the film-forming resin, a radical polymerization cured product of the acrylic insulating adhesive exhibits a glass transition temperature of 150 to 185° C., a linear expansion coefficient ($\alpha 1$) of 30 to 35 ppm in a temperature range that is lower than the glass transition temperature, and a linear expansion coefficient ($\alpha 2$) of 105 to 125 ppm in a temperature range that is equal to or higher than the glass transition temperature, and the following expression (1) is satisfied:

$$\alpha 2/\alpha 1 \geq 3.4 \tag{1}$$

Further, the present invention also provides a radical polymerization cured product of this acrylic insulating adhesive.

In addition, the present invention provides a connection structure in which an electronic part and a circuit board are fixed by a radical polymerization cured product of the above-described radical-polymerizable acrylic insulating adhesive, and a bump of the electronic part is directly bonded to a connection pad of the circuit board.

The present invention also provides a method for producing the above connection structure, including: supplying the above-described radical-polymerizable acrylic insulating adhesive onto a circuit board; positioning a bump of an electronic part with respect to a connection pad of the circuit board; and heating and pressing the electronic part to cause the acrylic insulating adhesive to undergo radical polymerization curing, so that the electronic part is fixed to the circuit board and the bump of the electronic part is directly bonded to the connection pad of the circuit board.

Advantages of the Invention

The acrylic insulating adhesive according to the present invention includes a (meth)acrylate monomer, a film-forming resin, an inorganic filler, a silane coupling agent, and a radical polymerization initiator. However, the content of the inorganic filler is greater than conventionally, and the glass transition temperature of the acrylic insulating adhesive is much higher than conventionally. Moreover, since the linear expansion coefficients of the acrylic insulating adhesive either side of this glass transition temperature are set in specific ranges, respectively, radical polymerization curing can be carried out at the comparatively low temperature of 160 to 200° C. in a heating time of 5 to 10 seconds. Still further, since stress relaxation properties are excellent, good connection reliability can be realized.

EMBODIMENT(S) FOR CARRYING OUT THE INVENTION

The radical-polymerizable acrylic insulating adhesive according to the present invention is an adhesive for fixing an electronic part to a circuit board, and is characterized by including a (meth)acrylate monomer, a film-forming resin, an inorganic filler, a silane coupling agent, and a radical polymerization initiator.

The (meth)acrylate monomer, which is one of the constituent components of the acrylic insulating adhesive according to the present invention, mainly imparts cohesive force to the polymerization cured product of the adhesive, and can also impart mechanical properties. Here, the term "(meth)acrylate monomer" means an acrylate monomer or a methacrylate monomer.

Examples of (meth)acrylate monomers that may be used include a monofunctional (meth)acrylate monomer, a polyfunctional (meth)acrylate monomer, or a modified monofunctional or polyfunctional (meth)acrylate monomer obtained by introducing an epoxy group, a urethane group, an amino group, an ethylene oxide group, a propylene oxide group and the like into a monofunctional or polyfunctional (meth)acrylate monomer. In the present invention, although a monofunctional (meth)acrylate monomer can be used alone as the (meth)acrylate monomer, in order to set the glass transition temperature of the polymerization cured product of the adhesive to be comparatively higher and to further increase the cohesive force, it is preferred to use a polyfunctional (meth)acrylate monomer for at least a part of, and more preferably all of, the (meth)acrylate monomer.

Examples of the monofunctional (meth)acrylate monomer include a (meth)acrylate resin having at least one or more (meth)acryloyl groups in one molecule, and a modified product thereof. Examples of such a modified product include tetrahydrofurfuryl acrylate, isobornyl acrylate, methyl methacrylate-acrylate, ethyl methacrylate-acrylate, tricyclodecane dimethanol diacrylate, tricyclodecane dimethanol dimethacrylate, ethoxylated bisphenol A diacrylate, propoxylated bisphenol A diacrylate, pentaerythritol triacrylate, and ethoxylated isocyanuric acid triacrylate.

In the acrylic insulating adhesive according to the present invention, as long as the effects of the present invention are not harmed, the (meth)acrylate monomer can be used together with some other radical-copolymerizable monomer. Examples of this other monomer include (meth)acrylic acid, vinyl acetate, styrene, vinyl chloride, and vinyl chloride.

The acrylic insulating adhesive according to the present invention includes a film-forming resin. The film-forming resin has a glass transition temperature of 50° C. or more, is a solid resin at normal temperatures, and is compatible with the (meth)acrylate monomer. The film-forming resin is for the purpose of increasing the glass transition temperature of the radical polymerization cured product of the acrylic insulating adhesive. Examples of such a film-forming resin include a phenoxy resin, a polyvinyl acetal resin, a polyvinyl butyral resin, an alkylated cellulose resin, a polyester resin, an acrylic resin, a styrene resin, a urethane resin, and a polyethylene terephthalate resin. Of these, a phenoxy resin which has a molecular weight of 10,000 to 100,000 and which has a fluorene skeleton in the molecule is preferred. Specific examples of such a film-forming resin having a fluorene skeleton include FX293 (manufactured by NSCC Epoxy Manufacturing Co., Ltd.).

In the present invention, if the used amount of the film-forming resin is too low, the film-forming properties of the acrylic insulating adhesive are insufficient, while if the used amount thereof is too high, cohesive force is harmed due to the relative decrease in the used amount of the (meth)acrylate monomer being too much. Therefore, the used amount of the film-forming resin is preferably 50 to 100 parts by mass with respect to 100 parts by mass of the (meth)acrylate monomer.

The acrylic insulating adhesive according to the present invention includes an inorganic filler in order to, for example, adjust the melt viscosity, improve flame retardance, and improve dimensional stability. Examples of inorganic fillers that can be used include aluminum hydroxide, magnesium hydroxide, calcium carbonate, magnesium carbonate, calcium silicate, magnesium silicate, calcium oxide, magnesium oxide, alumina powder, crystalline silica, amorphous silica, aluminum nitride, boron nitride powder, and aluminum borate whisker. Of these, it is preferred to use crystalline silica. These inorganic fillers may have regular shape, such as a sphere, or an irregular shape.

If the particle size of the inorganic filler is too small, this can cause an increase in binder viscosity, making it impossible to perform coating well. If the particle size is too large, this can cause "filler attack". Therefore, the particle size thereof is preferably 0.005 to 15 μm, and more preferably 0.01 to 1 μm.

In the present invention, if the used amount of the inorganic filler is too low, good conduction reliability cannot be obtained, while if the used amount thereof is too high, this can cause an increase in binder viscosity, making it impossible to perform coating well. Therefore, the used amount of the inorganic filler is preferably 70 to 160 parts by mass with respect to a total of 100 parts by mass of the (meth)acrylate monomer and the film-forming resin, and 50 to 150 parts by mass with respect to 100 parts by mass of the used resin.

The acrylic insulating adhesive according to the present invention includes a silane coupling agent in order to improve the adhesion between the polymerization cured product of the adhesive and the IC chip, the circuit board, or the inorganic filler. Examples of the silane coupling agent include γ-glycidopropyltrimethoxysilane, γ-mercaptopropyltrimethoxysilane, γ-aminopropyl-triethoxysilane, γ-ureidopropyltriethoxysilane, N-β-aminoethyl-γ-aminopropyltrimethoxysilane, and γ-methacryloxypropyltrimethoxysilane. Of these, γ-methacryloxypropyl-trimethoxysilane may be preferably used.

In the present invention, if the used amount of the silane coupling agent is too small, the adhesive force is insufficient, while if the used amount thereof is too high, air bubbles can be produced during the thermal curing. Therefore, the used amount of the silane coupling agent is preferably 0.1 to 5 parts by mass with respect to a total of 100 parts by mass of the (meth)acrylate monomer and the film-forming resin.

The acrylic insulating adhesive according to the present invention includes a radical polymerization initiator to cause radical polymerization with the (meth)acrylate monomer. Examples that can be used for this radical polymerization initiator include organic peroxides, such as benzoyl peroxide, dicumyl peroxide, and dibutyl peroxide, and azobis compounds, such as azobisisobutyronitrile and azobisvaleronitrile. Of these, benzoyl peroxide may be preferably used.

In the present invention, if the used amount of the radical polymerization initiator is too low, rapid curing becomes impossible, while if the used amount thereof is too high, the cured product hardens and adhesion deteriorates. Therefore, the used amount of the radical polymerization initiator is preferably 1 to 10 parts by mass with reference to a total of 100 parts by mass of the (meth)acrylate monomer and the film-forming resin.

In addition to the components described above, it is preferred that the acrylic insulating adhesive according to the present invention include a stress relaxing agent to improve connection reliability. Examples that may be used as the stress relaxing agent include a rubber and a thermoplastic elastomer that are compatible with the film-forming resin and the polymerization cured product of the (meth)acrylate monomer. Examples of this rubber and thermoplastic elastomer include acrylic rubber, nitrile butadiene rubber (NBR), and butadiene rubber (PB). Two or more kinds of these may be used together.

In the present invention, if using a stress relaxing agent, if the used amount thereof is too low, a sufficient stress relaxation effect cannot be obtained, while if the used amount is too high, the stress alleviating agent becomes immiscible. Therefore, the used amount thereof is preferably 1 to 10 parts by mass with respect to a total of 100 parts by mass of the (meth)acrylate monomer and the film-forming resin.

In addition to the components described above, the acrylic insulating adhesive according to the present invention may optionally include a solvent, such as toluene, methyl ethyl ketone, and ethyl acetate, a colorant, an antioxidant, a preservative and the like.

A radical polymerization cured product of the acrylic insulating adhesive according to the present invention exhibits a glass transition temperature of 150 to 185° C., and preferably of 155 to 175° C. If the glass transition temperature is less than 150° C., the connection reliability during heating is harmed. Although it is possible to set the radical polymerization curing conditions from a comparatively low temperature of about 130° C., from the perspective of obtaining a practical polymerization rate, the heating temperature may be set at 160 to 200° C. The heating time in such a case is 5 to 10 seconds.

The radical polymerization cured product of the acrylic insulating adhesive according to the present invention exhibits a linear expansion coefficient ($\alpha 1$) of 30 to 35 ppm in a temperature range (i.e., the usage temperature of the connection structure in which the radical polymerization cured product is applied) that is lower than the glass transition temperature, specifically, 0 to 50° C., and a linear expansion coefficient ($\alpha 2$) of 105 to 125 ppm in a temperature range (i.e., solder reflow processing temperature) that is equal to or higher than the glass transition temperature, specifically, 185 to 200° C. If the linear expansion coefficient ($\alpha 1$) exceeds 35 ppm, connection reliability is harmed, and is thus not preferred. Furthermore, if the linear expansion coefficient ($\alpha 2$) exceeds 125 ppm, connection reliability is harmed, and is thus not preferred.

Furthermore, the acrylic insulating adhesive according to the present invention needs to satisfy the following expression (1):

$$\alpha 2/\alpha 1 \geq 3.4 \tag{1}$$

The reason for this is because if $\alpha 2/\alpha 1$ is less than 3.4, connection reliability is harmed.

The radical polymerization cured product of the acrylic insulating adhesive according to the present invention which has such properties is also a part of the present invention.

The acrylic insulating adhesive according to the present invention can be preferably applied when NCF bonding an IC chip to a circuit board. Specifically, the acrylic insulating adhesive according to the present invention can be preferably applied in a connection structure in which an electronic part and a circuit board are fixed by the radical polymerization cured product of the acrylic insulating adhesive of the present invention, and a bump of the electronic part is directly bonded to a connection pad of the circuit board. This connection structure is also one aspect of the present invention.

Examples of the electronic part include an IC chip having a bump and a light emitting diode chip having a bump. The bump is not especially limited, although a stud bump that contributes to a finer pitch and a smaller surface area can preferably be used. A preferred height for such a stud bump is 30 to 100 μm. Further, examples of the circuit board include a glass epoxy circuit board, a glass substrate, and a flexible circuit board that have a connection pad made of copper, aluminum or the like.

Such a connection structure can be produced by supplying the acrylic insulating adhesive according to the present invention onto the circuit board by known supply means such as a dispenser, positioning the bump of the electronic part with respect to the connection pad of the circuit board by a known technique, and heating and pressing the electronic part to cause the acrylic insulating adhesive to undergo radical polymerization curing so that the electronic part is fixed to the circuit board the bump of the electronic part is directly bonded to the connection pad of the circuit board. Here, an example of preferred heating and pressing conditions is a heating temperature of 160 to 200° C., a heating time of 5 to 10 seconds, and a pressure of 10 to 100 g/bump.

EXAMPLES

The present invention will now be described in more detail by way of the following examples.

Examples 1 to 4 and Comparative Examples 1 to 6

(1) Preparation of Acrylic Insulating Adhesive

Acrylic insulating adhesives were prepared by uniformly mixing the components in the blends shown in Table 1 with a mixer. However, in Comparative Example 5, an epoxy insulating adhesive was prepared. Further, in Comparative Example 6, an acrylic anisotropic conductive adhesive was prepared.

(2) Measurement of Glass Transition Temperature

A completely-cured sample was produced by heat pressing at 190° C. for 30 minutes. Then, a test piece was produced having a 20 mm length, a 2 mm width, and a 0.05 mm height. The glass transition temperature of the produced test piece was measured based on JIS K7244. The obtained results are shown in Table 1.

(3) Measurement of Linear Expansion Coefficient

A completely-cured sample was produced by heat pressing at 190° C. for 30 minutes. Then, a cylindrical test piece was produced having a 5 mm length and a 1.5 mm diameter. The linear expansion coefficient ($\alpha 1$) of the produced test piece in a temperature range of 0 to 50° C. lower than the glass transition temperature and the linear expansion coefficient ($\alpha 2$) thereof in the temperature range of 185 to 200° C. higher than the glass transition temperature were measured based on JIS K7197. The obtained results are shown in Table 1.

(4) Production of Connection Structure

An adhesive was pasted on a connection pad surface of a 0.5 mm-thick glass epoxy substrate for evaluation on which a copper connection pad was formed. Meanwhile, a 70 μm-high gold stud bump was formed by a bonding machine on a surface of a 0.4 mm-thick IC chip for evaluation for which a reliability TEG (test element group) was formed. The stud bump face of the evaluation IC chip and the connection pad face of the evaluation glass epoxy substrate faced each other, and the bump and the connection pad were positioned. The IC chip and the glass epoxy substrate were then sandwiched by 50 μm-thick perfluoroethylene sheets, and thermally compressed under the following thermal compression conditions A or B.

Thermal Compression Conditions A: 190° C., 5 seconds, 12.8 kgf/chip (80 gf/bump)

Thermal Compression Conditions B: 190° C., 10 seconds, 12.8 kgf/chip (80 gf/bump)

<Evaluation 1 (Connection Reliability Evaluation)>

Connection resistance was measured by a four probe method for the initial connection structure, for the connection structure after moisture/reflow processing (after leaving for 24 hours in an 85° C., 85% RH environment, then passing three times through a reflow furnace having a maximum temperature of 260° C.), and for the connection structure after a PCT test (after leaving for 96 hours in a 121° C. saturated vapor environment). The obtained results are shown in Table 1.

<Evaluation 2 (Moisture Peeling Test Evaluation)>

The occurrence of peeling on the evaluation IC chip for the initial connection structure, for the connection structure after moisture/reflow processing (after leaving for 24 hours in an 85° C., 85% RH environment, then passing three times through a reflow furnace having a maximum temperature of 260° C.), or for the connection structure after a PCT test (after leaving for 96 hours in a 121° C. saturated water vapor environment) was observed using a scanning acoustic tomography (SAT). Cases in which peeling was not observed were evaluated as an "A," and cases in which peeling was observed were evaluated as a "B." The obtained results are shown in Table 1.

<Overall Evaluation>

The connection structures after moisture/reflow and after the PCT test were evaluated according to the following criteria based on the results of both the above evaluations 1 and 2. The obtained results are shown in Table 1.

Excellent [Exc]: Connection resistance (evaluation 1) was 0.02Ω or less, and peeling (evaluation 2) was not observed.

Good [G]: While partial peeling (evaluation 2) was observed, connection resistance (evaluation 1) was 0.02Ω or less, and thus there would be no problems in practical use.

Not Good [NG]: Peeling (evaluation 2) was observed, and connection resistance (evaluation 1) exceeded 0.02Ω (including opens).

TABLE 1

| | | Example | | | | | Comparative Example | |
|---|---|---|---|---|---|---|---|---|
| | | 1 | 2 | 3 | 4 | 5 | 1 | 2 |
| Acrylate Monomer (parts by mass) | 3002 *1 | 10 | 10 | 8 | 10 | 10 | 10 | 10 |
| | DCP *2 | 20 | 10 | 8 | 20 | 20 | 10 | 10 |
| | M315 *3 | — | 8 | 4 | 8 | — | 8 | 8 |
| Epoxy Monomer (parts by mass) | jER828 *4 | — | — | — | — | — | — | — |
| Film-Forming Resin (parts by mass) | FX293 *5 | 18 | 20 | 18 | 20 | — | 20 | 20 |
| | YP50 *6 | — | — | — | — | 18 | — | — |
| Stress relaxation Agent (parts by mass) | SG80H *7 | 2 | 2 | 2 | 2 | 2 | 2 | 2 |
| Inorganic Filler (parts by mass) | SO-E2 *8 | 50 | 50 | 60 | 40 | 50 | 30 | 20 |
| Silane Coupling Agent [phr] | KBM503 *9 | 1 | 1 | 1 | 1 | 1 | 1 | 1 |
| | A-187 *10 | — | — | — | — | — | — | — |
| Radical Polymerization Initiator [phr] | Nyper BW *11 | 3 | 3 | 3 | 3 | 3 | 3 | 3 |
| Epoxy Curing Agent (parts by mass) | HX3941HP *12 | — | — | — | — | — | — | — |
| Conductive Particles | AUL *13 | — | — | — | — | — | — | — |
| Glass Transition Temperature | [° C.] | 165 | 175 | 175 | 175 | 155 | 175 | 175 |
| Linear Expansion Coefficient ($\alpha 1$) | [ppm] | 34 | 34 | 30 | 35 | 34 | 41 | 45 |
| Linear Expansion Coefficient ($\alpha 2$) | [ppm] | 117 | 117 | 105 | 123 | 117 | 138 | 145 |
| $\alpha 2/\alpha 1$ | | 3.44 | 3.44 | 3.5 | 3.51 | 3.44 | 3.37 | 3.22 |
| Thermal Compression Conditions A | | | | | | | | |
| Evaluation 1 Connection Resistance [Ω] | Initial | ≤0.02 | ≤0.02 | ≤0.02 | ≤0.02 | ≤0.02 | ≤0.02 | ≤0.02 |
| | After Moisture/Reflow | ≤0.02 | ≤0.02 | ≤0.02 | ≤0.02 | ≤0.02 | ≤0.02 | ≤0.02 |
| | After PCT Test | ≤0.02 | ≤0.02 | ≤0.02 | ≤0.02 | ≤0.02 | open | open |
| Evaluation 2 Moisture Peeling Test | Initial | A | A | A | A | A | A | A |
| | After Moisture/Reflow | A | A | A | A | A | B | B |
| | After PCT Test | A | A | A | A | B | B | B |
| Thermal Compression Conditions B | | | | | | | | |
| Evaluation 1 Connection Resistance [Ω] | Initial | ≤0.02 | ≤0.02 | ≤0.02 | ≤0.02 | ≤0.02 | ≤0.02 | ≤0.02 |
| | After Moisture/Reflow | ≤0.02 | ≤0.02 | ≤0.02 | ≤0.02 | ≤0.02 | ≤0.02 | ≤0.02 |
| | After PCT Test | ≤0.02 | ≤0.02 | ≤0.02 | ≤0.02 | ≤0.02 | open | open |

TABLE 1-continued

| Evaluation 2 | Moisture Peeling Test | Initial | A | A | A | A | A | A | A |
|---|---|---|---|---|---|---|---|---|---|
| | | After Moisture/Reflow | A | A | A | A | A | B | B |
| | | After PCT Test | A | A | A | A | B | B | B |
| Overall Evaluation | | | | | | | | | |
| | After Moisture/Reflow | | EXC | EXC | EXC | EXC | EXC | G | G |
| | After PCT Test | | EXC | EXC | EXC | EXC | G | NG | NG |

| | | | Comparative Example | | | | |
|---|---|---|---|---|---|---|---|
| | | | 3 | 4 | 5 | 6 | 7 |
| Acrylate Monomer (parts by mass) | | 3002 *1 | 10 | 10 | — | 10 | — |
| | | DCP *2 | 10 | 10 | — | 20 | 30 |
| | | M315 *3 | 8 | 8 | — | — | — |
| Epoxy Monomer (parts by mass) | | jER828 *4 | — | — | 20 | — | — |
| Film-Forming Resin (parts by mass) | | FX293 *5 | 20 | 20 | — | 18 | 18 |
| | | YP50 *6 | — | — | 10 | — | — |
| Stress relaxation Agent (parts by mass) | | SG80H *7 | 2 | 2 | — | 2 | 2 |
| Inorganic Filler (parts by mass) | | SO-E2 *8 | 10 | — | 50 | 50 | 50 |
| Silane Coupling Agent [phr] | | KBM503 *9 | 1 | 1 | — | 1 | 1 |
| | | A-187 *10 | — | — | 1 | — | — |
| Radical Polymerization Initiator [phr] | | Nyper BW *11 | 3 | 3 | — | 3 | 3 |
| Epoxy Curing Agent (parts by mass) | | HX3941HP *12 | — | — | 20 | — | — |
| Conductive Particles | | AUL *13 | — | — | — | 10 | — |
| Glass Transition Temperature | | [° C.] | 175 | 175 | 150 | 165 | 190 |
| Linear Expansion Coefficient ($\alpha 1$) | | [ppm] | 50 | 58 | 32 | 34 | 34 |
| Linear Expansion Coefficient ($\alpha 2$) | | [ppm] | 164 | 179 | 120 | 117 | 117 |
| $\alpha 2/\alpha 1$ | | | 3.28 | 3.09 | 3.75 | 3.44 | 3.44 |
| Thermal Compression Conditions A | | | | | | | |
| Evaluation 1 | Connection Resistance [$\Omega$] | Initial | ≤0.02 | ≤0.02 | ≤0.04 | ≤0.02 | ≤0.02 |
| | | After Moisture/Reflow | ≤0.02 | ≤0.02 | ≤0.05 | ≤0.02 | ≤0.02 |
| | | After PCT Test | open | open | 0.5≤ | 0.5≤ | open |
| Evaluation 2 | Moisture Peeling Test | Initial | A | A | A | A | A |
| | | After Moisture/Reflow | B | B | A | A | A |
| | | After PCT Test | B | B | B | A | B |
| Thermal Compression Conditions B | | | | | | | |
| Evaluation 1 | Connection Resistance [$\Omega$] | Initial | ≤0.02 | ≤0.02 | ≤0.02 | ≤0.02 | ≤0.02 |
| | | After Moisture/Reflow | ≤0.02 | ≤0.02 | ≤0.06 | ≤0.02 | ≤0.02 |
| | | After PCT Test | open | open | 0.12 | 0.5≤ | open |
| Evaluation 2 | Moisture Peeling Test | Initial | A | A | A | A | A |
| | | After Moisture/Reflow | B | B | A | A | A |
| | | After PCT Test | B | B | B | A | B |
| Overall Evaluation | | | | | | | |
| | After Moisture/Reflow | | G | G | NG | EXC | EXC |
| | After PCT Test | | NG | NG | NG | NG | NG |

Table 1 Note:
*1 Epoxy-ester resin, Kyoeisha Chemical Co., Ltd.
*2 Tricyclodecane dimethacrylate, Shin-Nakamura Chemical Co., Ltd.
*3 Triisocyanurate, Toagosei Co., Ltd.
*4 Bisphenol A type liquid epoxy resin, Japan Epoxy Resin Co.
*5 Fluorene type phenoxy resin, Tohto Kasei Co., Ltd.
*6 Bisphenol A type phenoxy resin, Tohto Kasei Co., Ltd.
*7 Hydroxyl-group-containing acrylic rubber, Nagase ChemteX Corporation
*8 Amorphous silica particles with average particle size 0.5 μm, Admatechs Company Limited
*9 Acrylate silane coupling agent, Shin-Etsu Chemical Co. Ltd.
*10 Epoxy silane coupling agent, Momentive Performance Materials Inc.
*11 Organic peroxide (radical curing agent), NOF Corporation
*12 Latent imidazole curing agent, Asahi Kasei Chemicals Corporation
*13 Conductive particles with particle size 5 μm, Sekisui Chemical Co., Ltd.

It can be seen from Table 1 that in Examples 1 to 5, for both thermal compression conditions A and B, the results for connection reliability for the initial, after moisture/reflow processing, and after PCT test evaluations were good, and the results for moisture peeling test showed that there would be no problems in practical use.

On the other hand, when the used amount of the inorganic filler is less than 70 parts by mass with respect to a total of 100 parts by mass of the (meth)acrylate monomer and the film-forming resin, peeling partially occurred after the moisture/reflow processing and after the PCT test, and connection resistance after the PCT test increased, which caused open circuits. Consequently, in terms of practical characteristics, a not-good evaluation was made.

Comparative Example 5 used an epoxy insulating adhesive instead of an acrylic insulating adhesive. Consequently, the thermal compression time was insufficient, so that the initial and after-moisture/reflow connection resistances were high. Especially, the connection resistance after the PCT test exceeded 0.5Ω. Furthermore, for Comparative Example 6, in which conductive particles were added, it is thought that because the conductive particles were not sufficiently trapped between the stud bump and the electrode pad, the connection resistance after the PCT test exceeded 0.5Ω.

INDUSTRIAL APPLICABILITY

The radical-polymerizable acrylic insulating adhesive according to the present invention can undergo radical polymerization curing under the comparatively low temperature heating conditions of 160 to 200° C. in a heating time of 5 to 10 seconds. Furthermore, the acrylic insulating adhesive has excellent stress relaxation properties. Therefore, the acrylic insulating adhesive of the present invention is useful as an adhesive used in the NCF bonding of an electric part such as an IC chip to a circuit board.

The invention claimed is:

1. An acrylic insulating adhesive for fixing an electronic part to a circuit board, comprising
    a (meth)acrylate monomer,
    a film-forming resin,
    an inorganic filler,
    a silane coupling agent,
    a stress relaxing agent in an amount of 1 to 10 parts by mass with respect to the total of 100 parts by mass of the (meth)acrylate monomer and the film-forming resin, and
    a radical polymerization initiator, wherein
        an amount of the inorganic filler is 70 to 160 parts by mass with respect to a total of 100 parts by mass of the (meth)acrylate monomer and the film-forming resin,
        the stress relaxing agent includes at least one of nitrile butadiene rubber (NBR) and butadiene rubber (PB),
        a radical polymerization cured product of the acrylic insulating adhesive exhibits a glass transition temperature of 150 to 185° C., a linear expansion coefficient (a1) of 30 to 35 ppm in a temperature range that is lower than the glass transition temperature, and a linear expansion coefficient (a2) of 105 to 125 ppm in a temperature range that is equal to or higher than the glass transition temperature, and
        the following expression (1) is satisfied:
$$a2/a1^3 \geq 3.4 \qquad (1).$$

2. The acrylic insulating adhesive according to claim 1, wherein an amount of the film-forming resin is 50 to 100 parts by mass with respect to 100 parts by mass of the (meth)acrylate monomer, an amount of the silane coupling agent is 0.1 to 5 parts by mass with respect to the total of 100 parts by mass of the (meth)acrylate monomer and the film-forming resin, and an amount of the radical polymerization initiator is 1 to 10 parts by mass with reference to the total of 100 parts by mass of the (meth)acrylate monomer and the film-forming resin.

3. The acrylic insulating adhesive according to claim 1, wherein the film-forming resin is a phenoxy resin.

4. A radical polymerization cured product of an acrylic insulating adhesive for fixing an electronic part to a circuit board, comprising
    a (meth)acrylate monomer,
    a film-forming resin,
    an inorganic filler,
    a silane coupling agent,
    a stress relaxing agent in an amount of 1 to 10 parts by mass with respect to the total of 100 parts by mass of the (meth)acrylate monomer and the film-forming resin, and a radical polymerization initiator, wherein
        an amount of the inorganic filler is 70 to 160 parts by mass with respect to a total of 100 parts by mass of the (meth)acrylate monomer and the film-forming resin,
        the stress relaxing agent includes at least one of nitrile butadiene rubber (NBR) and butadiene rubber (PB),
        the radical polymerization cured product exhibits a glass transition temperature of 150 to 185° C., a linear expansion coefficient (a1) of 30 to 35 ppm in a temperature range that is lower than the glass transition temperature, and a linear expansion coefficient (a2) of 105 to 125 ppm in a temperature range that is equal to or higher than the glass transition temperature, and
        the following expression (1) is satisfied:
$$a2/a1^3 \geq 3.4 \qquad (1).$$

5. A connection structure wherein an electronic part and a circuit board are fixed by the radical polymerization cured product of the acrylic insulating adhesive according to claim 1, and a bump of the electronic part is directly bonded to a connection pad of the circuit board.

6. The connection structure according to claim 5, wherein the electronic part is an IC chip having a stud bump.

7. A method for producing the connection structure in which an electronic part and a circuit board are fixed by the radical polymerization cured product of the acrylic insulating adhesive according to claim 1, and a bump of the electronic part is directly bonded to a connection pad of the circuit board, the method including: supplying the acrylic insulating adhesive onto a circuit board; positioning the bump on the electronic part with respect to the connection pad on the circuit board; and heating and pressing the electronic part to cause the acrylic insulating adhesive to undergo radical polymerization curing, so that the electronic part is fixed to the circuit board and the bump on the electronic part is directly bonded to the connection pad of the circuit board.

* * * * *